United States Patent
Daami et al.

(10) Patent No.: US 10,944,066 B2
(45) Date of Patent: Mar. 9, 2021

(54) PHOTORESISTOR WITH IMPROVED SENSITIVITY

(71) Applicants: COMMISSARIAT A L'ENERGIE ATOMIQUE ET AUX ENERGIES ALTERNATIVES, Paris (FR); ISORG

(72) Inventors: Anis Daami, Bembla (TN); Mohammed Benwadih, Champagny sur Marne (FR)

(73) Assignees: COMMISSARIAT A L'ENERGIE ATOMIQUE ET AUX ENERGIES ALTERNATIVES, Paris (FR); ISORG, Grenoble (FR)

( * ) Notice: Subject to any disclaimer, the term of this patent is extended or adjusted under 35 U.S.C. 154(b) by 152 days.

(21) Appl. No.: 16/067,942

(22) PCT Filed: Jan. 2, 2017

(86) PCT No.: PCT/FR2017/050001
§ 371 (c)(1),
(2) Date: Jul. 3, 2018

(87) PCT Pub. No.: WO2017/118805
PCT Pub. Date: Jul. 13, 2017

(65) Prior Publication Data
US 2020/0052232 A1    Feb. 13, 2020

(30) Foreign Application Priority Data
Jan. 5, 2016    (FR) .................... 16 50048

(51) Int. Cl.
*H01L 51/42*    (2006.01)
*H01L 51/00*    (2006.01)

(52) U.S. Cl.
CPC ........ *H01L 51/428* (2013.01); *H01L 51/0012* (2013.01); *H01L 51/424* (2013.01);
(Continued)

(58) Field of Classification Search
CPC ............... H01L 51/428; H01L 51/0012; H01L 51/0038; H01L 51/0047
See application file for complete search history.

(56) References Cited

U.S. PATENT DOCUMENTS

2007/0169814 A1    7/2007    Huck et al.
2007/0235753 A1*   10/2007   Debucquoy ......... H01L 51/0566
                                                             257/113
(Continued)

FOREIGN PATENT DOCUMENTS

DE    102007046444 A1    4/2009
DE    10201077961 A1    12/2012
(Continued)

OTHER PUBLICATIONS

Kobayashi et al. "Control of carrier density by self-assembled monolayers in organic field-effect transistors" in Nature Materials vol. 3, p. 317-322. Published by Nature Publishing Group in 2004. (Year: 2004).*

(Continued)

*Primary Examiner* — Tuan A Hoang
(74) *Attorney, Agent, or Firm* — Oblon, McClelland, Maier & Neustadt, L.L.P.

(57) ABSTRACT

A photoresistor comprises two electrodes connected by a photosensitive layer of the photoresistor, and at least one additional layer which is in contact with the photosensitive layer in order to influence the behavior of the photoresistor regarding carrier collection between the two electrodes, in order to improve the sensitivity of the photoresistor.

20 Claims, 3 Drawing Sheets

(52) U.S. Cl.
CPC ...... *H01L 51/0035* (2013.01); *H01L 51/0036* (2013.01); *H01L 51/0037* (2013.01); *H01L 51/0038* (2013.01); *H01L 51/0047* (2013.01)

(56) References Cited

U.S. PATENT DOCUMENTS

| | | | | |
|---|---|---|---|---|
| 2007/0262303 | A1* | 11/2007 | Yan | H01L 51/0012 257/40 |
| 2010/0207112 | A1* | 8/2010 | Furst | H01L 51/441 257/40 |
| 2013/0074920 | A1* | 3/2013 | Echegoyen | H01L 51/0077 136/256 |
| 2013/0285040 | A1 | 10/2013 | Cabanillas Gonzalez et al. | |
| 2014/0110695 | A1* | 4/2014 | Benwadih | H01L 51/4253 257/40 |
| 2014/0299776 | A1 | 10/2014 | Ajuria Arregui et al. | |
| 2015/0380668 | A1 | 12/2015 | Wang et al. | |

FOREIGN PATENT DOCUMENTS

| | | |
|---|---|---|
| DE | 102011077961 A1 | 12/2012 |
| FR | 2977080 A1 | 12/2012 |
| WO | WO 2004/095599 A1 | 11/2004 |
| WO | WO 2014/104976 A1 | 7/2014 |

OTHER PUBLICATIONS

Kobayashi et al. "Control of carrier density by self-assembled monolayers in organic field-effect transistors" in Nature Materials vol. 3 pp. 317 by Nature Publishing Group. (Year: 2004).*

International Search Report dated Apr. 12, 2017, in PCT/FR2017/050001, filed Jan. 2, 2017.

Kobayashi, S. et al., "Control of carrier density by self-assembled monolayers in organic field-effect transistors", Nature Materials, vol. 3, May 2004, pp. 317-322.

* cited by examiner

PHOTORESISTOR WITH IMPROVED SENSITIVITY

FIELD OF THE INVENTION

The invention relates to the field of photoresistors, and organic photoresistors in particular.

PRIOR ART

A photoresistor typically comprises two electrodes associated with a photosensitive layer in such a way that resistivity of the photoresistor is observed as a function of a luminous flux impinging on the photoresistor. The photoresistor is called organic when the photosensitive layer is formed from an organic material, notably an organic semiconductor.

A photoresistor of this kind is characterized by a leakage current, also called dark current, which corresponds to the residual current between the electrodes subjected to a given voltage when the photoresistor is not illuminated by the luminous flux, or in other words when the photoresistor is in the dark.

The sensitivity S of such photoresistor is then given by the following formula:

$$S = \frac{Current_{light} - Current_{dark}}{\text{Luminous power received}} \qquad \text{eq. 1}$$

where $Current_{light}$ corresponds to the current passing through the photoresistor when it is subjected to luminous flux issued from a light source of known power Luminous power received, and where $Current_{dark}$ corresponds to the value of dark current described above.

To improve the use of a photoresistor, it is preferable that it has high sensitivity. For this, it is usual to vary the characteristics of its photosensitive layer and/or of the electrodes in contact with said photosensitive layer.

Document DE102011077961 proposes a photosensitive device provided with a photosensitive layer and with an additional layer in contact with the electrodes and the photosensitive layer to improve the operation of the device.

There is a need to improve the sensitivity of photoresistors or find alternatives to improvement of the sensitivity.

OBJECT OF THE INVENTION

There is therefore a need to optimize the sensitivity of photoresistors, preferably by reducing the dark current of photoresistors and/or by promoting the conduction of the carriers photo-generated on exposure to light.

There is a tendency to satisfy this need by proposing a photoresistor comprising two electrodes connected by a photosensitive layer of the photoresistor, moreover the photoresistor comprises at least one additional layer in contact with the photosensitive layer so as to have an action on the behavior of the photoresistor with respect to collection of the carriers between the two electrodes in order to improve the sensitivity of the photoresistor.

According to one embodiment, said at least one additional layer is a self-assembled monolayer located between the two electrodes and configured so as to increase the resistivity of the photosensitive layer at its interface with said self-assembled monolayer to reduce the dark current of said photoresistor.

The photosensitive layer may be of p-type conductivity, and the self-assembled monolayer is then of n-type conductivity.

The photosensitive layer may be of n-type conductivity, and the self-assembled monolayer is then of p-type conductivity.

Preferably, the self-assembled monolayer extends between the two electrodes and is not in contact with the electrodes.

Advantageously, said at least one additional layer is a PEDOT:PSS layer formed on at least a part of a front face of the photosensitive layer opposite a rear face of the photosensitive layer in contact with the electrodes.

Preferably, the photoresistor comprises two additional layers, one of which is formed by the self-assembled monolayer, and the other is formed by the PEDOT:PSS layer.

Notably, at least a part of the photosensitive layer is sandwiched between the PEDOT:PSS layer and the self-assembled monolayer.

Preferably, the photosensitive layer is formed from a photosensitive organic semiconductor material.

Preferably, the photosensitive layer is in physical contact with the electrodes.

The invention also relates to a method of fabrication of a photoresistor as described, said method comprises: a step of forming two electrodes of the photoresistor; a step of forming a photosensitive layer of the photoresistor connecting the two electrodes; a step of forming at least one additional layer of the photoresistor intended to be in contact with the photosensitive layer so as to have an action on the behavior of the photoresistor with respect to collection of the carriers between the two electrodes in order to improve the sensitivity of the photoresistor.

Notably, the step of forming said at least one additional layer comprises forming a self-assembled monolayer between the two electrodes.

Advantageously, the step of forming said at least one additional layer comprises forming a PEDOT:PSS layer formed on at least a part of a front face of the photosensitive layer opposite a rear face of the photosensitive layer in contact with the electrodes.

DESCRIPTION OF THE FIGURES

The invention will be better understood on reading the following description, given purely as a nonlimiting example, and made referring to the drawings, in which.

In these figures, the same references are used for denoting the same elements.

DESCRIPTION OF PARTICULAR EMBODIMENTS OF IMPLEMENTATION OF THE INVENTION

In the rest of this description, characteristics and functions that are well known by a person skilled in the art will not be described in detail.

In the present description, "carriers" refers to electrons and/or holes, if applicable.

In the present description, when the word "transparency" or the word "transparent" is used, it refers to transparency to the luminous flux to which the photoresistor is intended to be subjected. Notably, this luminous flux is emitted by a light source. In particular, the transparency of a material to a light flux is defined when this material allows at least 90% of the luminous flux to pass through when the latter impinges on its interface; it should be noted that this does not mean that the material does not absorb a part of this luminous flux once it is inside its volume.

To calibrate a photoresistor, and find out its characteristics, it is possible to apply the following protocol: put the photoresistor in the dark and measure the dark current for various fixed values of voltage; put the photoresistor in a chamber comprising a light source, for example a light-emitting diode, of known current/luminous power efficiency (thus making it possible to determine the power of the light source simply by measuring its current) and measure the current of the photoresistor for the various fixed values of voltage, it is then easy to find the characteristics of the photoresistor using equation 1 (eq. 1) given above. Conventionally, the current may be measured using a multimeter.

The present photoresistor differs from the prior art notably in that it proposes the use of an additional layer judiciously placed so as to have an interface of contact with the photosensitive layer of the photoresistor between the electrodes of the photoresistor.

Returning to equation 1 described above, what is proposed here is to improve the sensitivity of the photoresistor either by increasing the current able to pass through it when the photoresistor is subjected to a luminous flux, or by decreasing the dark current. These two cases allow the sensitivity of the photoresistor to be improved independently. This relates quite particularly to the behavior of the carriers between the two electrodes, to propose the addition of at least one additional layer making it possible, because of its contact with the photosensitive layer, to have an action on the behavior of the photoresistor with respect to collection of the carriers between the electrodes.

Figure 1:
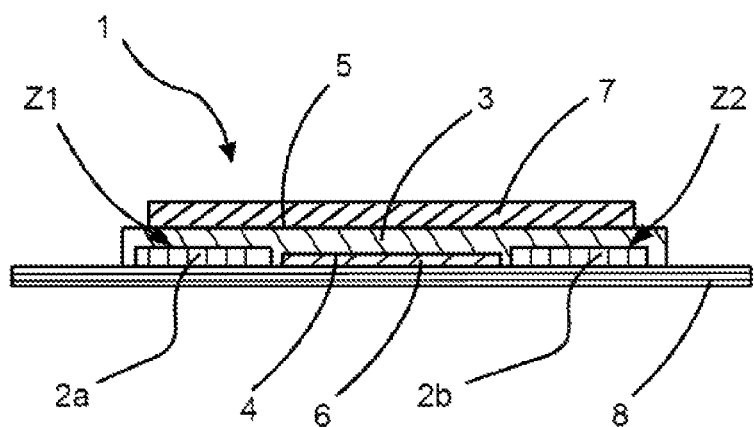
FIG. 1 is a schematic sectional view of an execution of a photoresistor according to one embodiment of the invention.

FIG. 1 shows a photoresistor 1 according to one embodiment of the invention. The photoresistor 1 comprises two electrodes 2a, 2b connected by a photosensitive layer 3 of the photoresistor 1. In other words, the photosensitive layer 3 is in physical contact with the two electrodes 2a, 2b. The two electrodes 2a, 2b may be transparent, for example formed from ITO (indium tin oxide) with a thickness of the order of 50 nm, or else may be formed from some other metallic material such as gold, silver or nickel, or else may be formed from TCO (transparent conducting oxide) and in this case the thickness of the electrodes may be 100 nm. The photosensitive layer 3 is preferably formed from a photosensitive organic semiconductor material, for example of the P3HT:PCBM type, and then the photoresistor 1 is an organic photoresistor. The photosensitive layer 3 advantageously has a thickness comprised between 300 nm and 800 nm, and more particularly between 500 nm and 700 nm. In particular, the photosensitive layer 3 comprises a first face 4, of which a first zone Z1 is in contact with one of the electrodes 2a and a second zone Z2 is in contact with the other of the electrodes 2b. Moreover, the photosensitive layer 3 comprises a second face 5 opposite the first face 4. The distance separating the first and second faces 4, gives the thickness of the photosensitive layer 3. The second face 5 is preferably the face intended to be oriented toward the luminous flux. P3HT:PCBM is a p-type semiconductor polymer (electron donor) comprising P3HT, the abbreviation for poly(3-hexylthiophene), or else poly(3-hexylthiophene-2,5-diyl) mixed with an electron acceptor, PCBM, abbreviation for [6,6]-phenyl-C61-methyl butanoate.

Furthermore, the photoresistor 1 comprises at least one additional layer 6, 7 in contact with the photosensitive layer 3 so as to have an action on the behavior of the photoresistor with respect to collection of the carriers between the two electrodes 2a, 2b in order to improve the sensitivity of the photoresistor 1. "Have an action on the behavior of the photoresistor with respect to collection of the carriers between the two electrodes" means notably that said at least one additional layer 6, 7 is not interposed between one or other of the electrodes 2a, 2b and the photosensitive layer 3, and that a face of the additional layer 6, 7 in contact with one of the faces of the photosensitive layer 3 comprises at least one portion that is not located facing one or other of the electrodes 2a, 3b. In other words, said portion of said at least one additional layer 6, 7 is not located directly above a face for injection or collection of carriers of one or other of the electrodes 2a, 2b in the photosensitive layer 3.

In a first case, it is possible to improve the sensitivity of the photoresistor 1 by making the photosensitive layer 3 less electrically conductive between the two electrodes 2a, 2b. In this first case the aim is to reduce the dark current. In the dark, one of the electrodes 2a will inject carriers into the photosensitive layer 3, and then these carriers will be propagated in the photosensitive layer 3, to be collected by the other of the electrodes 2b. The propagation of the carriers in the dark is such that a channel will form between the two electrodes 2a, 2b at the level of the first face 4 of the photosensitive layer 3 in contact with the two electrodes 2a, 2b. On increasing the resistivity of the channel, less injection of carriers will be possible, and consequently the current due to these carriers will be decreased.

To implement the first case, said at least one additional layer 6 is preferably a self-assembled monolayer 6 located between the two electrodes 2a, 2b, and configured so as to increase the resistivity of the photosensitive layer 3 at its interface with said self-assembled monolayer 6 to reduce the dark current of said photoresistor 1. The self-assembled monolayer 6 is also known in this field by the acronym SAM. The self-assembled monolayer 6 makes it possible to modify the resistivity of the channel mentioned above. More particularly, the self-assembled monolayer 6 is in contact with the first face 4 of the photosensitive layer 3. This self-assembled monolayer 6 may extend between the two electrodes 2a, 2b but is not in contact with the electrodes 2a, 2b as this would result in altering the work functions of the electrodes 2a, 2b and consequently induce poor collection of the carriers photogenerated under illumination. In other words, the self-assembled monolayer is distant from the electrodes 2a, 2b. In fact, the self-assembled monolayer performs the role of a defect between the electrodes 2a, 2b and makes it possible to collect the carriers injected by the electrodes in order to reduce the dark current of the photoresistor. The self-assembled monolayer makes it possible to trap the carriers circulating between the two electrodes 2a, 2b under the photosensitive layer 3.

To improve the increase in resistivity of the photosensitive layer 3 at its interface with the self-assembled monolayer 6, it is possible to take account of the conductivity of the photosensitive layer 3. In the present description, conductivity means electrical conductivity. In this sense, if the photosensitive layer 3 is of p-type conductivity, then the self-assembled monolayer is of n-type conductivity, notably in this case the self-assembled monolayer 6 is of 4-methoxythiophenol. Conversely, if the photosensitive layer 3 is of the n-type (i.e. of n-type conductivity), then the self-assembled monolayer 6 is of p-type conductivity, notably in this case the self-assembled monolayer 6 is of pentafluoro-benzenethiol. It is then said that the photosensitive layer 3 is compensated at its interface with the self-assembled monolayer 6, because if the photosensitive layer 3 is of p-type (carrier of positive charges: holes), a self-assembled monolayer 6 of n-type, which collects holes, is introduced, and vice versa, if the photosensitive layer 3 is of n-type (carrier of negative charges: electrons), a self-assembled monolayer 6 of p-type, which collects electrons, is introduced. In other words, to improve the photoresistor 1, it is possible to use doped materials for forming the photosensitive layer 3 and the self-assembled monolayer 6. Regarding the photosensitive layer 3, since the P3HT:PCBM material has p-type conduction, it is suitable for the self-assembled monolayer 6 of the n-type. For the self-assembled monolayer 6 of the p-type, the photosensitive layer 3, then n-type conduction, may be PCNEPV, which is the abbreviation of poly[oxa-1,4-phenylene-(1-cyano-1,2-vinylene)-(2-methoxy-5-(3,7-dimethyloctyloxy)-1,4-phenylene)-1,2-(2-cyanovinylene)-1,4-phenylene].

An example of self-assembled monolayer with 4-methoxythiophenol and an example of self-assembled monolayer with pentafluoro-benzenethiol have been described above. More generally, a self-assembled monolayer may comprise, or be of, benzenethiol (whose abbreviation is BT), or 4-nitrobenzenethiol (whose abbreviation is NBT), or 4-methylbenzenethiol (whose abbreviation is MBT), or 4-hydroxybenzenethiol (HBT), or 4-methoxybenzenethiol (whose abbreviation is MOBT), or 4-fluorobenzenethiol (whose abbreviation is FBT), or pentafluorobenzenethiol (whose abbreviation is PFBT), or 4-chlorobenzenethiol (whose abbreviation is CBT), or pentachlorobenzenethiol (whose abbreviation is PCBT), or 4-bromobenzenethiol (whose abbreviation is BBT).

In the case when the self-assembled monolayer comprises, or is of, benzenethiol (BT), or 4-nitrobenzenethiol (NBT), or 4-methylbenzenethiol (MBT), or 4-hydroxybenzenethiol (HBT), or 4-methoxybenzenethiol (MOBT), it is a self-assembled monolayer with n-type conductivity. In the case when the self-assembled monolayer comprises, or is of, 4-fluorobenzenethiol (FBT), or pentafluorobenzenethiol (PFBT), or 4-chlorobenzenethiol (CBT), or pentachlorobenzenethiol (PCBT), or 4-bromobenzenethiol (BBT), it is a self-assembled monolayer with p-type conductivity.

The examples given above for making the self-assembled monolayers make it possible to reduce the dark current of the photoresistor by trapping charge carriers, electrons or holes as applicable, injected when the photoresistor is polarized but is not illuminated, the result of which is to have an action on the behavior of the photoresistor with respect to collection of the carriers since its current will be reduced.

The first case is notably implemented when the photoresistor 1 is incorporated in a detector, a matrix imager or else used alone, in fact in this case the dark current defines the minimum detection threshold of said detector or imager.

In a second case, it is possible to improve the sensitivity by at least locally increasing the conductivity of the photosensitive layer 3. In fact, when the photoresistor 1 is placed under a luminous flux this generates carriers within the photosensitive layer 3 that must be recovered/collected at the level of the electrodes as quickly as possible to prevent their recombination. It is therefore proposed here to provide these carriers with a path that is energetically more favorable to follow in order to improve the collection of said carriers by the electrodes 2a, 2b. In this case said at least one additional layer 7 makes it possible to perform this function.

For implementing this second case, said at least one additional layer may be a PEDOT:PSS layer 7 notably formed on at least a part of a front face—the second face 5 mentioned above—of the photosensitive layer 3 opposite a rear face—the first face 4 mentioned above—of the photosensitive layer 3 in contact with the electrodes 2a, 2b, and notably intended to be oriented toward the luminous flux. In other words, this PEDOT:PSS layer 7 is transparent. PEDOT:PSS offers the advantage that it has a higher electrical conductivity than the photosensitive layer 3, notably when the latter is of P3HT:PCBM. Notably, PEDOT:PSS may be generalized to a layer made of polymer material having a higher conductivity than the photosensitive layer 3. This PEDOT:PSS layer may have a thickness of the order of a micrometer, and more particularly comprised between 200 nm and 500 nm. Notably, here the PEDOT:PSS is said to be "floating", i.e. it is not used as an electrode, and it allows an improvement of the sensitivity of the photoresistor when the photoresistor is illuminated by promoting conduction of the carriers photo-generated under illumination.

It will be understood that in the second case the additional layer is distant from the electrodes. In other words, the first case and the second case may be generalized as follows: said at least one additional layer is distant from the electrodes: i.e. it is not in contact with the electrodes.

PEDOT:PSS (poly(3,4-ethylenedioxythiophene)polystyrene sulfonate) is a polymer that is a mixture of two ionomeric components, PEDOT: poly(3,4-ethylenedioxythiophene), which is a conjugated polymer, and PSS: polystyrene sodium sulfonate, which is a sulfonated polystyrene. The mixture forms a conductive transparent polymer with very good conductivity. It can transport both electrons and holes. In this sense, in the context of the present invention, PEDOT:PSS allows, on the one hand, passage of the luminous flux so that the latter can generate carriers in the photosensitive layer 3, and on the other hand, promotes transport of the carriers generated in the photosensitive layer 3 to improve their collection and therefore limit their recombination.

The first and second cases mentioned above each make it possible to improve the sensitivity. They may be applied alone or in combination. In the case when the first and second cases are combined, the photoresistor 1 comprises two additional layers 6, 7, one of which is formed by the self-assembled monolayer 6, and the other is formed by the PEDOT:PSS layer 7.

Figure 2:
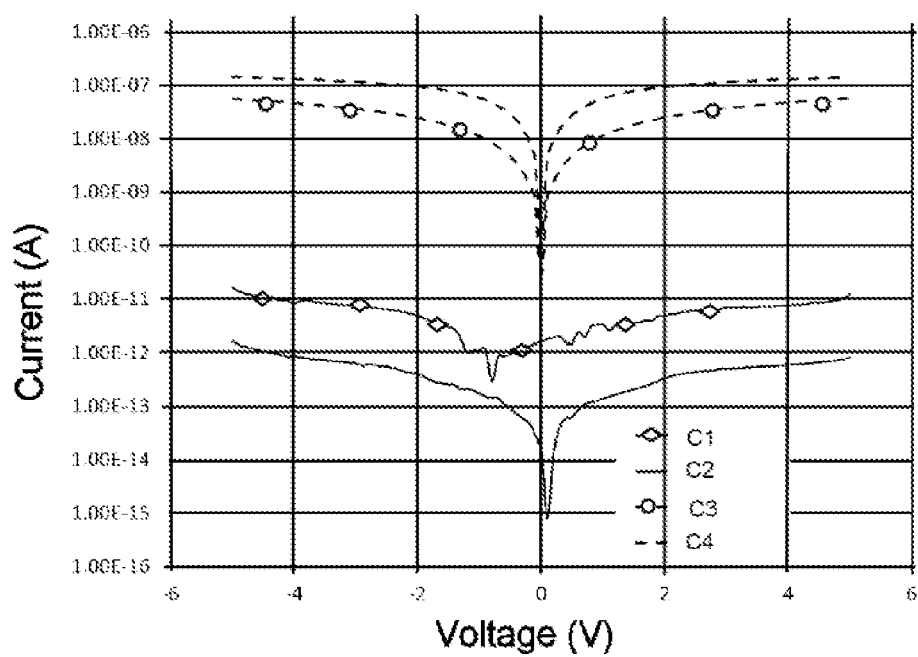
FIG. 2 is a graph on a logarithmic scale for comparing the currents under illumination (curves C3 and C4) and in the dark (curves C1 and C2) of a conventional photoresistor (curves C1 and C3) with those of a photoresistor provided with a self-assembled monolayer under the photosensitive layer and with a PEDOT:PSS layer on top of the photosensitive layer (curves C2 and C4) as a function of the voltage applied to the terminals of the photoresistors.

FIG. 2 is a graph showing the current passing through the photoresistor 1 as a function of the voltage applied to the electrodes 2a, 2b according to four curves C1, C2, C3, C4. These four curves were obtained according to the protocol described above. Curve C1 shows the current as a function of the voltage when the photoresistor 1, without the self-assembled monolayer 6 and the PEDOT:PSS layer, is in the dark. Curve C2 shows the current as a function of the voltage when the photoresistor 1 comprises the self-assembled monolayer 6 and the PEDOT:PSS layer, and is in the dark. Curve C3 shows the current as a function of the voltage when the photoresistor 1, without the self-assembled monolayer 6 and the PEDOT:PSS layer, is placed under a calibrated luminous flux. Curve C4 shows the current as a function of the voltage when the photoresistor 1 comprises the self-assembled monolayer 6 and the PEDOT:PSS layer, and is placed under a calibrated luminous flux. It is thus possible to observe a reduction of the order of a decade on the dark current depending on whether or not the self-assembled monolayer 6 and the PEDOT:PSS layer are implemented (curves C1 and C2). It can be seen that the leakage current/dark current is higher without the self-assembled monolayer 6 than with it. In fact, the self-assembled monolayer 6 acts at its interface with the photosensitive layer 3 as carrier trapping sites. Thus, when the carriers are injected from one electrode to another, they are trapped on the sites (polymer tentacles that collect/trap the carriers), and consequently the carrier flux decreases compared to the leakage current if there is no self-assembled monolayer 6. Moreover, curves C3 and C4 also make it possible to visualize the gain notably associated with the PEDOT:PSS layer. To summarize, the gain in dark current is explained by the presence of the self-assembled monolayer 6 and the gain in light current is due to the PEDOT:PSS 7, each having a different role.

Figure 3:
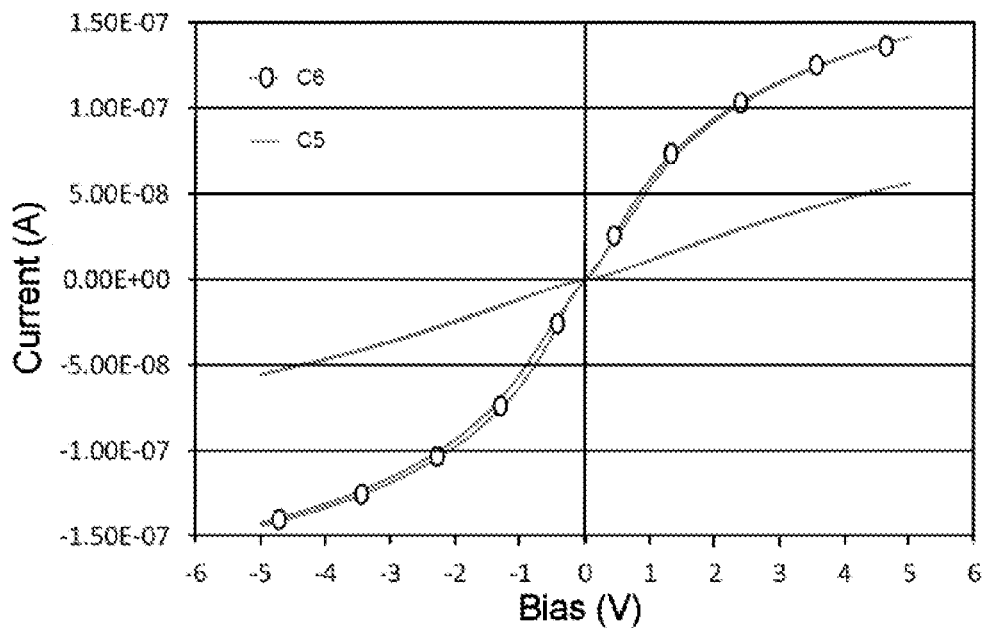
FIG. 3 illustrates the advantage of using the PEDOT:PSS layer (curve C6) relative to a photoresistor without such a layer (curve C5), showing the variation of the current under illumination on a linear scale as a function of the bias voltage.

FIG. 3 illustrates the current passing through the photoresistor as a function of its bias voltage on a linear scale. Curve C5 shows the variation of the current passing through the photoresistor 1 without the PEDOT:PSS layer 7 (and without the self-assembled monolayer) under illumination as a function of the bias voltage, and curve C6 shows the variation of the current passing through the photoresistor 1 with the PEDOT:PSS layer 7 (and with the self-assembled monolayer 6) under illumination as a function of the bias voltage. In fact, FIG. 3 is a repeat, on a linear scale, of the curves under illumination (curves C3 to C5 and C4 to C6) of FIG. 2 and show the increase of the gain under illumination. Curve C6 appears divided in two as it goes forward and back on the bias during the experiment. For a bias voltage of 5V, it is noted that the current passing through the photoresistor 1 is multiplied by three through use of the PEDOT:PSS layer 7.

Figure 6:
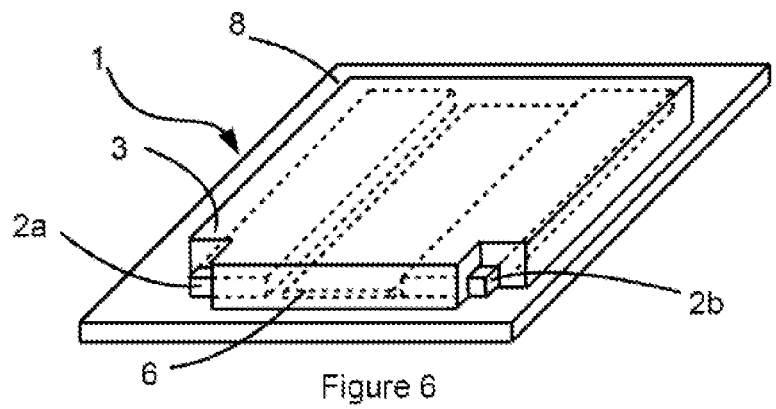
FIG. 6 illustrates formation of a photosensitive layer on the structure of FIG. 5.
Figure 7:
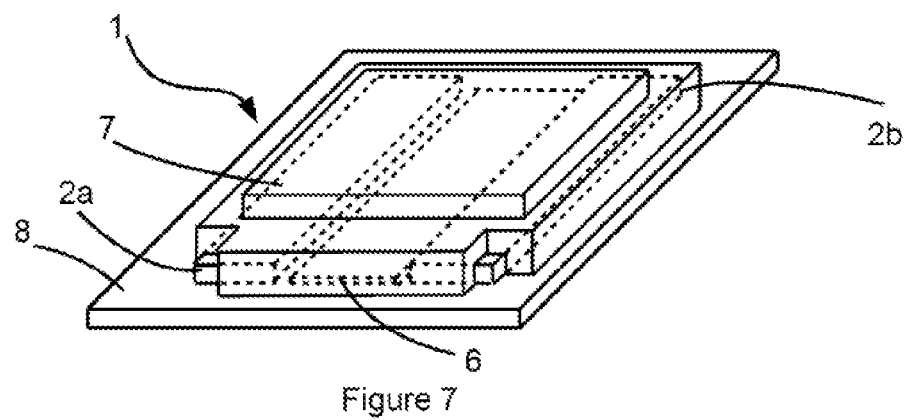
FIG. 7 illustrates formation of a PEDOT:PSS layer on the structure of FIG. 6.
Figure 9:
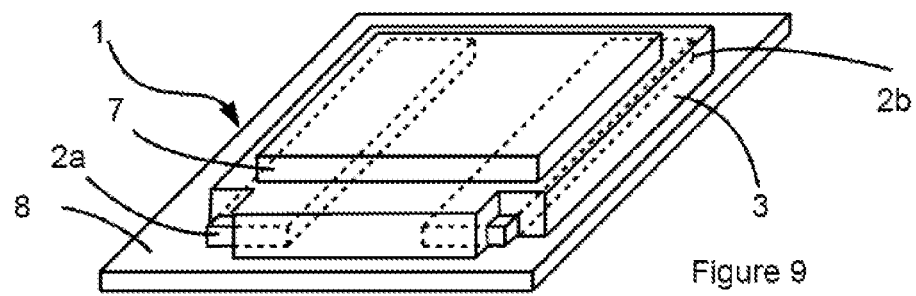
FIG. 9 illustrates formation of a PEDOT:PSS layer on the structure of FIG. 8.

The combination of the first and second cases is illustrated in FIGS. 1 and 7. FIG. 6 illustrates the first case taken alone, and FIG. 9 illustrates the second case taken alone. In the context of the combination of the first and second cases, each layer (the self-assembled monolayer and the PEDOT:PSS layer) contributes to a given current, and the sum is given by equation 1, which shows that the gain of the PEDOT:PSS 7 has more effect on the overall sensitivity than the self-assembled monolayer 6, as the current under illumination is very high relative to the dark current (the self-assembled monolayer only improving the sensitivity threshold of the photoresistor).

Preferably, as shown in FIG. 1, at least a part of the photosensitive layer 3 is sandwiched between the PEDOT:PSS layer 7 and the self-assembled monolayer 6, the two faces then making it possible to improve two characteristics of the sensitivity of the photoresistor, namely to increase the current under illumination and reduce the dark current.

More particularly, the photoresistor 1 comprises a substrate 8, on which the electrodes 2a, 2b are arranged, as well as the self-assembled monolayer 6, which is then formed on the substrate 8 in a space located between the electrodes 2a, 2b.

The invention also relates to a method of fabrication of the photoresistor 1 as described. FIGS. 4 to 9 illustrate different steps of said method. The elements shown with dotted lines in FIGS. 6 to 9 are elements that are covered and are not visible from the outside. Notably, the method of fabrication comprises the following steps: a step of forming two electrodes 2a, 2b of the photoresistor (FIG. 4); a step of forming a photosensitive layer 3 of the photoresistor connecting the two electrodes 2a, 2b (FIGS. 6 and 8); a step of forming at least one additional layer 6, 7 (FIGS. 5, 6, 7, 9) of the photoresistor 1 intended to be in contact with the photosensitive layer 3 so as to have an action on the behavior of the photoresistor with respect to collection of the carriers between the two electrodes 2a, 2b in order to improve the sensitivity of the photoresistor 1.

Figure 4:
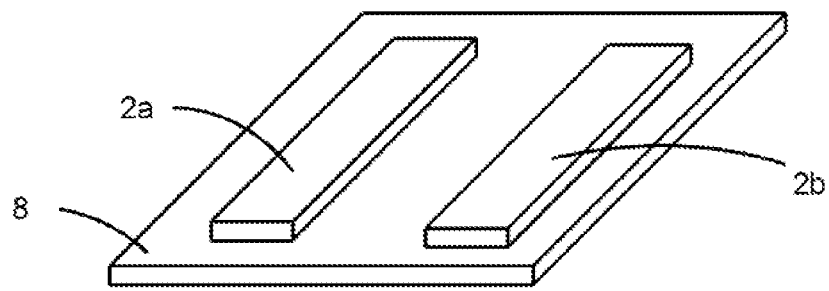
FIG. 4 illustrates a step of forming two electrodes notably on a substrate.
Figure 5:
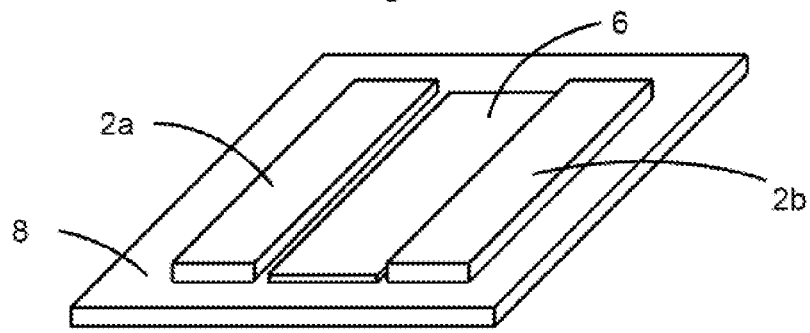
FIG. 5 illustrates formation of a self-assembled monolayer starting from the structure of FIG. 4.

The step of forming the two electrodes 2a, 2b, preferably transparent, may be carried out by deposition on a suitable substrate 8 (FIG. 4). In particular, the two electrodes 2a, 2b may be deposited by one of the following techniques: screen printing, printing, evaporation by CVD (chemical vapor deposition), evaporation by PVD (physical vapor deposition). Other techniques for deposition of the electrodes 2a, 2b may also be envisaged by a person skilled in the art. These electrodes may have a thickness comprised between 20 nm and 100 nm and preferably equal to 50 nm if they are metal electrodes (gold, nickel, silver), or comprised between 70 nm and 150 nm and preferably equal to 100 nm if they are of TCO.

The substrate 8 may be flexible or rigid, and transparent to light. For example, the substrate 8 may be of a type selected from PEN (abbreviation of polyethylene naphthalate), PET (abbreviation of polyethylene terephthalate), Kapton® (polyimide film developed by the company Dupont and corresponding to poly(4,4'-oxydiphenylene-pyromellitimide)), or other. The substrate 8 is preferably of glass or plastic so as to allow illumination of the photosensitive layer 3 from both sides.

According to a particular implementation, the electrodes 2a, 2b may be produced as follows: the substrate 8, made of glass or of plastic, is covered with 125 nm of ITO deposited by spraying and then cleaned in an ultrasonic bath successively in DIW (abbreviation of deionized water), acetone and isopropanol for 10 minutes for each of the baths. The substrate 8 is then dried under a nitrogen stream. The step of forming the electrodes 2a, 2b then comprises a photolithography step carried out to define the pattern of the electrodes 2a, 2b. During this photolithography step, photosensitive resin is deposited using a spinner on the layer of ITO. A mask comprising the patterns of the electrodes 2a, 2b is then deposited on the resin, which is finally exposed under an ultraviolet lamp. The unexposed resin is removed in a chemical bath, and the layer of ITO that is now bare is etched for 5 minutes in a hydrochloric acid bath. The exposed resin is then removed in a special chemical bath. Then the substrate 8 is cleaned again with the same ultrasonic baths, finally obtaining the two electrodes 2a, 2b formed on the substrate 8.

Preferably, for the first case, the step of forming said at least one additional layer 6 (FIG. 5) comprises the formation, notably before the step of forming the photosensitive layer 3 (FIG. 6), of the self-assembled monolayer 6 between the two electrodes 2a, 2b, notably in such a way that this self-assembled monolayer 6 is not in contact with the two electrodes 2a, 2b. In particular, this self-assembled monolayer 6 is deposited on the substrate 8 between the two electrodes 2a, 2b formed on this substrate 8. The deposition of the self-assembled monolayer 6 can be done by dipping in a previously prepared solution or by printing. More generally, it is said that the step of forming the self-assembled monolayer 6 is a grafting step. Preferably, the self-assembled monolayer 6 has a thickness of the order of the length of the molecules used. In particular, the thickness of the self-assembled monolayer 6 is comprised between 0.5 nm and 1 nm.

Still in the first case, the step of forming the photosensitive layer 3 is then carried out (FIG. 6) by depositing the latter on the electrodes 2a, 2b and on the self-assembled monolayer 6, notably in such a way that the latter covers the free parts of the electrodes 2a, 2b and of the self-assembled monolayer 6 prior to its deposition, and comes into contact with the substrate 8. The step of forming the photosensitive layer 3 is notably such that following its deposition said photosensitive layer 3 has a thickness comprised between 300 nm and 800 nm.

Figure 8:
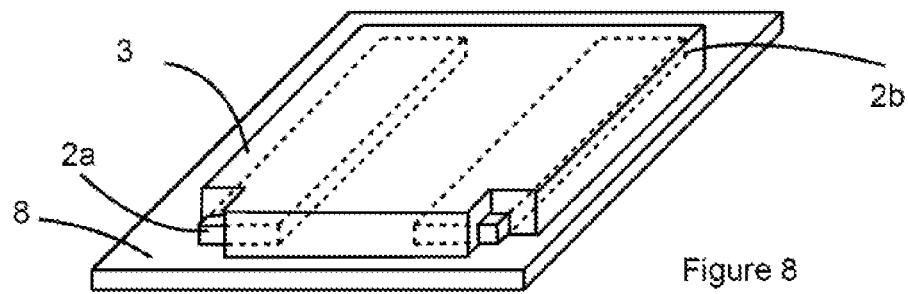
FIG. 8 illustrates another embodiment comprising a photosensitive layer made on the structure of FIG. 4.

In the second case, according to a first variant, the photosensitive layer 3 is deposited on the electrodes 2a, 2b, and notably on the substrate 8 between the two electrodes 2a, 2b (FIG. 8). This photosensitive layer 3 may have the same characteristics of material or of thickness as in the first case. Then, after formation of the photosensitive layer 3, the step of forming said at least one additional layer then consists of depositing a PEDOT:PSS layer 7 on the photosensitive layer 3 (FIG. 9). In this first variant, the self-assembled monolayer is not present in the photoresistor 1.

In a second variant of the second case, the latter is combined with the first case. Accordingly, after formation of the photosensitive layer 3, the step of forming said at least one additional layer further comprises a step of forming the PEDOT:PSS layer 7 formed on at least a part of a front face of the photosensitive layer 3 (FIG. 7). It will then be understood that the step of forming said at least one additional layer in fact comprises the formation of two additional layers 6, 7, one of which—the self-assembled monolayer 6—is produced before the step of forming the photosensitive layer 3, and the other one—the PEDOT:PSS layer 7—is formed after the step of forming the photosensitive layer 3.

In other words, the step of forming said at least one additional layer comprises the formation of a PEDOT:PSS layer 7 notably formed on at least a part of the front face 5 of the photosensitive layer 3 opposite a rear face of the photosensitive layer 3 in contact with the electrodes 2a, 2b. The PEDOT:PSS layer may cover the photosensitive layer 3 as far as the substrate, of course if it does not create a short-circuit between the electrodes.

Generally, applicable to the two variants of the second case, the formation of the PEDOT:PSS layer 7 may be made by deposition, notably of the type selected from: deposition by spin-coating, deposition by printing or deposition by screen printing. In particular, the PEDOT:PSS layer may be deposited by screen printing through a mask, and once the layer 7 has been deposited, the substrate 8 is annealed under a nitrogen stream at 110° C. for 20 minutes to evaporate the water.

The PEDOT:PSS used may be that from the company Heraeus:Clevios known by the reference PVPAI4083®.

The photosensitive layer 3 may be formed by preparing a solution of P3HT:PCBM at a total concentration of 50 mg/ml and a polymer (P3HT): fullerene (PCBM) ratio of 1:1 in a chlorobenzene solution. The solution is stirred for 3 hours on a heating plate at 60° C. The material is then deposited by screen printing through a mask previously formed to give the correct dimensions of the photoresistor. Annealing is then performed for 5 min at 80° C. to evaporate the solvent. Of course, this solution may also be deposited by other techniques such as screen printing, spin-coating or printing.

Generally, the photoresistor and the method are linked in such a way that all the characteristics of the photoresistor may be produced during appropriate steps of the method, and so that all the structural characteristics described in combination with the method, notably the thicknesses of the layers and the materials used, may be integrated in the photoresistor.

In particular, although the face 5 of the photosensitive layer 3 is that preferred to be oriented toward the source of the luminous flux to be quantified, the thickness ranges given above for the electrodes 2a, 2b, the self-assembled monolayer 6, the PEDOT:PSS layer 7 are notably such that these elements are transparent to allow illumination of the photoresistor 1 both from its front face located at the level of the PEDOT:PSS layer 1 and from its rear face located at the level of the self-assembled monolayer 6 or the substrate 8 (which is then also transparent).

The photoresistor as described may be used for forming a light sensor, a detection matrix based on photoresistors or some other imager.

In FIGS. 6 to 9, it can be seen that the photosensitive layer 3 does not cover the electrodes completely, with the aim of leaving a contact zone at the level of each electrode 2a, 2b.

According to an implementation, during fabrication, there may be a plurality of self-assembled monolayers. However, only one is grafted, the other self-assembled monolayers just being placed/adsorbed (there is no chemical attack). In the case of rinsing during the fabrication method, only the grafted layer remains.

The invention claimed is:

1. A photoresistor comprising:
   two electrodes in contact with a photosensitive layer of the photoresistor, wherein the photoresistor comprises two additional layers each in contact with the photosensitive layer so as to have an action on the behavior of the photoresistor with respect to collection of the carriers between the two electrodes in order to improve the sensitivity of the photoresistor, and
   one of the two additional layers is formed by a self-assembled monolayer, and the other of the additional layers is formed by a PEDOT:PSS layer.

2. The photoresistor according to claim 1, wherein the self-assembled monolayer is located between the two electrodes and configured so as to increase the resistivity of the photosensitive layer at its interface with said self-assembled monolayer to reduce the dark current of said photoresistor.

3. The photoresistor according to claim 2, wherein the photosensitive layer is of p-type conductivity, and the self-assembled monolayer is of n-type conductivity.

4. The photoresistor according to claim 2, wherein the photosensitive layer is of n-type conductivity, and the self-assembled monolayer is of p-type conductivity.

5. The photoresistor according to claim 1, wherein the self-assembled monolayer extends between the two electrodes and is not in contact with the electrodes.

6. The photoresistor according to claim 1, wherein the PEDOT:PSS layer is formed on at least a part of a front face of the photosensitive layer opposite a rear face of the photosensitive layer, the rear face being in contact with the electrodes.

7. The photoresistor according to claim 1, wherein the PEDOT:PSS layer is formed over the photosensitive layer and not in contact with the electrodes and the self-assembled monolayer.

8. The photoresistor according to claim 1, wherein at least a part of the photosensitive layer is sandwiched between the PEDOT:PSS layer and the self-assembled monolayer.

9. The photoresistor according to claim 1, wherein the photosensitive layer is formed from a photosensitive organic semiconductor material.

10. The photoresistor according to claim 1, wherein the photosensitive layer is in physical contact with the electrodes.

11. A method of fabrication of the photoresistor according to claim 1, the method comprising:
a step of forming the two electrodes of the photoresistor,
a step of forming the self-assembled monolayer,
a step of forming the PEDOT:PSS layer, and
a step of forming the photosensitive layer of the photoresistor in contact with the two electrodes,
wherein the self-assembled monolayer and the PEDOT:PSS layer are in contact with the photosensitive layer so as to have an action on the behavior of the photoresistor with respect to collection of the carriers between the two electrodes in order to improve the sensitivity of the photoresistor.

12. The method according to claim 11, wherein the step of forming the self-assembled monolayer comprises forming the self-assembled monolayer between the two electrodes.

13. The method according to claim 11, wherein the step of forming the PEDOT:PSS layer comprises forming the PEDOT:PSS layer on at least a part of a front face of the photosensitive layer opposite a rear face of the photosensitive layer, the rear face being in contact with the electrodes.

14. The method according to claim 11, comprising:
forming the self-assembled monolayer between the two electrodes and not in contact with the two electrodes,
forming the photosensitive layer to have a first face in contact with the two electrodes and the self-assembled monolayer, and
forming the PEDOT:PSS layer on at least a part of a second face of the photosensitive layer opposite the first face.

15. The photoresistor according to claim 1, comprising:
a substrate having a main surface, wherein
the two electrodes are formed on the main surface, and
the self-assembled monolayer is disposed on the main surface under the photosensitive layer, between the two electrodes and not in contact with the electrodes.

16. A photoresistor comprising:
a substrate having a main surface,
two electrodes formed on the main surface,
a photosensitive layer connecting the two electrodes,
a first layer disposed on the main surface under the photosensitive layer, between the two electrodes and not in contact with the two electrodes,
a second layer disposed over the photosensitive layer and not in contact with the two electrodes,
wherein each of the first and second layers is configured to have an action on the behavior of the photoresistor with respect to collection of the carriers between the two electrodes in order to improve sensitivity of the photoresistor.

17. The photoresistor according to claim 16, wherein the first layer is configured so as to increase the resistivity of the photosensitive layer at its interface with said self-assembled monolayer to reduce dark current of said photoresistor.

18. The photoresistor according to claim 17, wherein the second layer is configured to promote conduction of carriers photo-generated in the photoresistor under illumination to improve a sensitivity of the photoresistor.

19. The photoresistor according to claim 16, wherein the second layer is configured to promote conduction of carriers photo-generated in the photoresistor under illumination to improve a sensitivity of the photoresistor.

20. The photoresistor according to claim 16, wherein the photosensitive layer is in contact with each of the two electrodes.

* * * * *